US007414422B2

(12) United States Patent
Aoyagi et al.

(10) Patent No.: US 7,414,422 B2
(45) Date of Patent: Aug. 19, 2008

(54) SYSTEM IN-PACKAGE TEST INSPECTION APPARATUS AND TEST INSPECTION METHOD

(75) Inventors: Masahiro Aoyagi, Tsukuba (JP);
Hiroshi Nakagawa, Tsukuba (JP);
Kazuhiko Tokoro, Tsukuba (JP);
Katsuya Kikuchi, Tsukuba (JP);
Yoshikuni Okada, Tsukuba (JP);
Hiroyuki Fujita, Kawasaki (JP);
Kenichi Kobayashi, Kawasaki (JP)

(73) Assignees: National Institute of Advanced Industrial Science and Technology, Tokyo (JP); Shinwa Corp. Ltd., Kanagawa (JP)

( * ) Notice: Subject to any disclaimer, the term of this patent is extended or adjusted under 35 U.S.C. 154(b) by 0 days.

(21) Appl. No.: 11/108,861

(22) Filed: Apr. 19, 2005

(65) Prior Publication Data

US 2005/0236717 A1   Oct. 27, 2005

(30) Foreign Application Priority Data

Apr. 22, 2004   (JP)   ............................. 2004-126226

(51) Int. Cl.
*G01R 31/26* (2006.01)
(52) U.S. Cl. ..................................... 324/765; 324/754
(58) Field of Classification Search .......... 324/754–765
See application file for complete search history.

(56) References Cited

U.S. PATENT DOCUMENTS

| | | | | |
|---|---|---|---|---|
| 4,731,577 A | * | 3/1988 | Logan | 324/754 |
| 5,194,932 A | * | 3/1993 | Kurisu | 257/773 |
| 5,198,755 A | * | 3/1993 | Ikeda et al. | 324/754 |
| 5,489,852 A | * | 2/1996 | Gomez | 324/754 |
| 5,491,427 A | * | 2/1996 | Ueno et al. | 324/754 |
| 5,986,460 A | * | 11/1999 | Kawakami | 324/765 |
| 6,285,203 B1 | * | 9/2001 | Akram et al. | 324/755 |
| 6,348,810 B1 | * | 2/2002 | Yanagawa et al. | 324/765 |

(Continued)

FOREIGN PATENT DOCUMENTS

JP   2004-31649   1/2004

*Primary Examiner*—Ha Nguyen
*Assistant Examiner*—Arleen M Vazquez
(74) *Attorney, Agent, or Firm*—Westerman, Hattori, Daniels & Adrian, LLP.

(57) ABSTRACT

A system in-package test inspection apparatus for measuring and evaluating the high-speed/high frequency characteristic of a system in-package through an electrode pad in which I/O terminals are formed on one side of an LSI package containing metallic wiring internally and plural LSI chips are stacked in multiple layers on the other face while electric connection between the LSI chip and the LSI package and the electric connection between the LSI chips are implemented, the system in-package test inspection apparatus comprising: a printed wiring substrate to which the I/O terminals of the system in-package are connected to enable transmission of high speed and high frequency signals; LSI chip driving means for driving the LSI chip; a contact probe having a contact electrode and for transmitting a high frequency signal; evaluation signal generating means for supplying a high frequency evaluation signal to the contact probe; output signal detecting means for detecting an output signal of the system in-package through the printed wiring board; and analyzing means for analyzing a signal detected by the output signal detecting means, wherein by contacting the contact electrode of the contact probe with an electrode pad formed on the LSI chip, the evaluation signal is inputted to the LSI chip not through metallic wiring within the LSI package.

5 Claims, 8 Drawing Sheets

U.S. PATENT DOCUMENTS

| | | | |
|---|---|---|---|
| 6,392,282 B1 * | 5/2002 | Sahara et al. | 257/438 |
| 6,400,168 B2 * | 6/2002 | Matsunaga et al. | 324/754 |
| 6,433,565 B1 * | 8/2002 | Desai et al. | 324/755 |
| 6,603,322 B1 * | 8/2003 | Boll et al. | 324/754 |
| 6,677,776 B2 * | 1/2004 | Doherty et al. | 324/765 |
| 6,822,541 B2 * | 11/2004 | Sue et al. | 333/247 |
| 6,916,682 B2 * | 7/2005 | Gerber et al. | 438/106 |
| 2005/0264313 A1 * | 12/2005 | Aoyagi et al. | 324/762 |

* cited by examiner g:ground
s:signal

Fig. 7
| STRUCTURE TYPE | DRAWING |
|---|---|
| CHIP STACK TYPE | 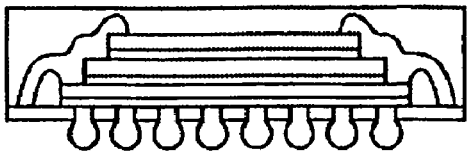 |
| PACKAGE STACK TYPE | 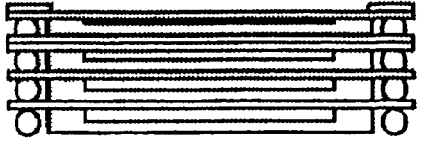 |
| WAFER STACK TYPE |  |
| PLAIN MULTI-CHIP TYPE | 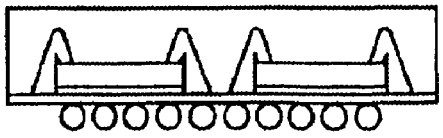 |

SYSTEM IN-PACKAGE TEST INSPECTION APPARATUS AND TEST INSPECTION METHOD

BACKGROUND OF THE INVENTION

1. Field of the Invention

The present invention relates to a mounting technology of electronic information transmission system and more particularly to a system in-package test inspection apparatus for measuring and evaluating high-speed/high frequency electric characteristic of a system in-package (SIP) whose system is established on a structure body loaded with a multiplicity of electronic components such as semiconductor integrated circuit (LSI) chips and the like and a test inspection method.

2. Description of the Related Art

The system in-package (hereinafter referred to as SIP) concerns technology for mounting a plurality of LSI chips in a single package and because high density and high speed electronic system can be constructed using an existing LSI chip, application development thereof onto ubiquitous high function information devices such as mobile phone has been advanced energetically. If classified depending on the configuration, the kinds of the SIP includes, as shown in FIG. 7, chip stack type, package stack type, wafer stack type, plane multi-chip type and the like.

Of the SIPs, the aforementioned package stack type and plane multi-chip type have been actually used and widely applied already.

On the other hand, because in the package stack type, wire between chips is short and high speed transmission can be achieved, its development has been achieved energetically and part thereof has been already utilized. Particularly, the chip stack type has been adopted in a mobile phone in which reduction of the size and intensification of performance have been demanded strongly such as portable phone, digital camera, personal digital assistance (PDA) and the like. The semiconductor device of the chip stack type has been described in, for example, Japanese Patent Application Laid-Open No. 2004-31649.

By the way, the performance required for the SIP has been demanded to be high electric performance and reliability in a frequency range of several GHz to several tens GHz accompanied by intensified performance of the apparatuses and a test inspection apparatus for measuring and evaluating that high speed/high frequency electric performance has been demanded.

Although the test inspection on the aforementioned package stack type and plane multi-chip type can be met by conventional technology, the chip stack type SIP which can be expected to reduce cost largely in the SIPs and is estimated to prevail rapidly has not been yet developed from viewpoints of high speed/high frequency test inspection technology.

FIG. 8 shows an example of the chip stack type SIP. As shown in the same Figure, in the chip stack type SIP 200, a plurality of LSI chips 202, 203, 204, 205 different in size are placed in multi-layers and bonding pads P formed on the respective layers are connected to each other with bonding wire W. In the meantime, input/output signals of the entire SIP 200 are inputted and outputted through soldering balls formed on the bottom face of the LSI package 201.

In such a chip stack type SIP 200, the test inspection of the SIP can be carried out through the soldering ball which is an I/O terminal. However, in the inspection of the high-speed/high-frequency characteristic, no high frequency signal can be transmitted due to an influence of inductance originating form a long wire within the LSI package 201, so that no accurate inspection is enabled.

Although the above-described problem can be solved if a test evaluation signal can be inputted directly into a signal line between the LSI chips, that is, to the bonding pad P or the bonding wire W not through the LSI package 201, the conventional probe cannot be contacted with only an arbitrary signal line because its pitch is very fine. That is, in case of the chip stack type, any inspection signal cannot be inputted from a signal line between stacked LSI chips and in test inspection, the inspection signal needs to be always inputted through the LSI package 201, and consequently, the high speed/high frequency characteristic cannot be inspected at a high precision.

SUMMARY OF THE INVENTION

The present invention has been achieved in views of the above-described situations and an object of the invention is to provide a system in-package test inspection apparatus in which upon manufacturing of the chip stack type SIP, high-speed, high-frequency test inspection is carried out by inputting an inspection signal from signal lines between the LSI chips so as to execute acceptable product inspection at a high precision, thereby securing reliability.

To achieve the above-described object, according to an aspect of the present invention, there is provided a system in-package test inspection apparatus for measuring and evaluating the high-speed/high frequency characteristic of a system in-package through an electrode pad in which I/O terminals are formed on one side of an LSI package containing metallic wiring internally and plural LSI chips are stacked in multiple layers on the other face while electric connection between the LSI chip and the LSI package and the electric connection between the LSI chips are implemented, the system in-package test inspection apparatus comprising: a printed wiring substrate to which the I/O terminals of the system in-package are connected to enable transmission of high speed and high frequency signals; LSI chip driving means for driving the LSI chip; a contact probe having a contact electrode and for transmitting a high frequency signal; evaluation signal generating means for supplying a high frequency evaluation signal to the contact probe; output signal detecting means for detecting an output signal of the system in-package through the printed wiring board; and analyzing means for analyzing a signal detected by the output signal detecting means, wherein by contacting the contact electrode of the contact probe with an electrode pad formed on the LSI chip, the evaluation signal is inputted to the LSI chip not through metallic wiring within the LSI package.

Preferably, the contact electrode of the contact probe has a signal electrode and a ground electrode while a distance between the electrodes is 20 μm to 100 μm. Further, it is permissible that the contact probe has plural contact electrodes for transmitting independent signals and that the plural contact electrodes are provided at an equal interval and in parallel to each other.

By using the probe capable of contacting the signal line between the LSI chips stacked in multiple layers on the system in-package and further, using the printed wiring board capable of handling the high-speed/high-frequency signal, the high-speed/high-frequency test inspection can be carried out at a high precision. That is, the inspection signal can be inputted to the LSI chip not through the metallic wiring formed within the LSI package, so that influences of inductance within the LSI package can be reduced largely thereby high frequency signal being transmitted excellently.

Therefore, on the manufacturing site of the system in-package, implementation of acceptable product inspection and securing of reliability can be achieved.

The signal line of signal transmission wire formed in the printed wiring board is preferred to be of a coaxial line structure which is surrounded by insulating layer while its outside is covered with sealing electrode.

Consequently, signals in the high-speed, high frequency area can be transmitted and further, influences of cross-talk between respective signal lines and external noise can be reduced.

Further, to achieve the above described object, according to another aspect of the present invention, there is provided a system in-package test inspection method for measuring and evaluating the high-speed/high frequency characteristic of a system in-package through an electrode pad in which I/O terminals are formed on one side of an LSI package containing metallic wiring internally and plural LSI chips are stacked in multiple layers on the other face while electric connection between the LSI chip and the LSI package and the electric connection between the LSI chips are implemented, the system in-package test inspection method comprising steps of: connecting the I/O terminals of the system in-package to a printed wiring board capable of transmitting a high speed/high frequency signal; making the contact electrode of a contact probe for transmitting the high frequency signal into a contact with an electrode pad formed on the LSI chip so as to input a high frequency evaluation signal into the LSI chip through the electrode pad; inspecting the output signal of the system in-package through the printed wiring board; and analyzing the output signal.

Preferably, the contact electrode of the contact probe has a signal electrode and a ground electrode while a distance between the electrodes is 20 µm to 100 µm.

According to these methods, the same effect as the aforementioned system in-package test inspection apparatus can be obtained. That is, because the inspection signal is inputted to the LSI chip not through the metallic wiring formed within the LSI package, influences of inductance within the LSI package can be reduced largely and the high frequency signal can be transmitted excellently. Therefore, the high speed/high frequency test inspection can be carried out at a high precision so that implementation of acceptable product inspection and securing of reliability can be achieved on the manufacturing site of the system in-package.

BRIEF DESCRIPTION OF THE DRAWINGS

FIG. 7 is a diagram showing the kind of the system in-package; and

DESCRIPTION OF THE PREFERRED EMBODIMENTS

Figure 1:
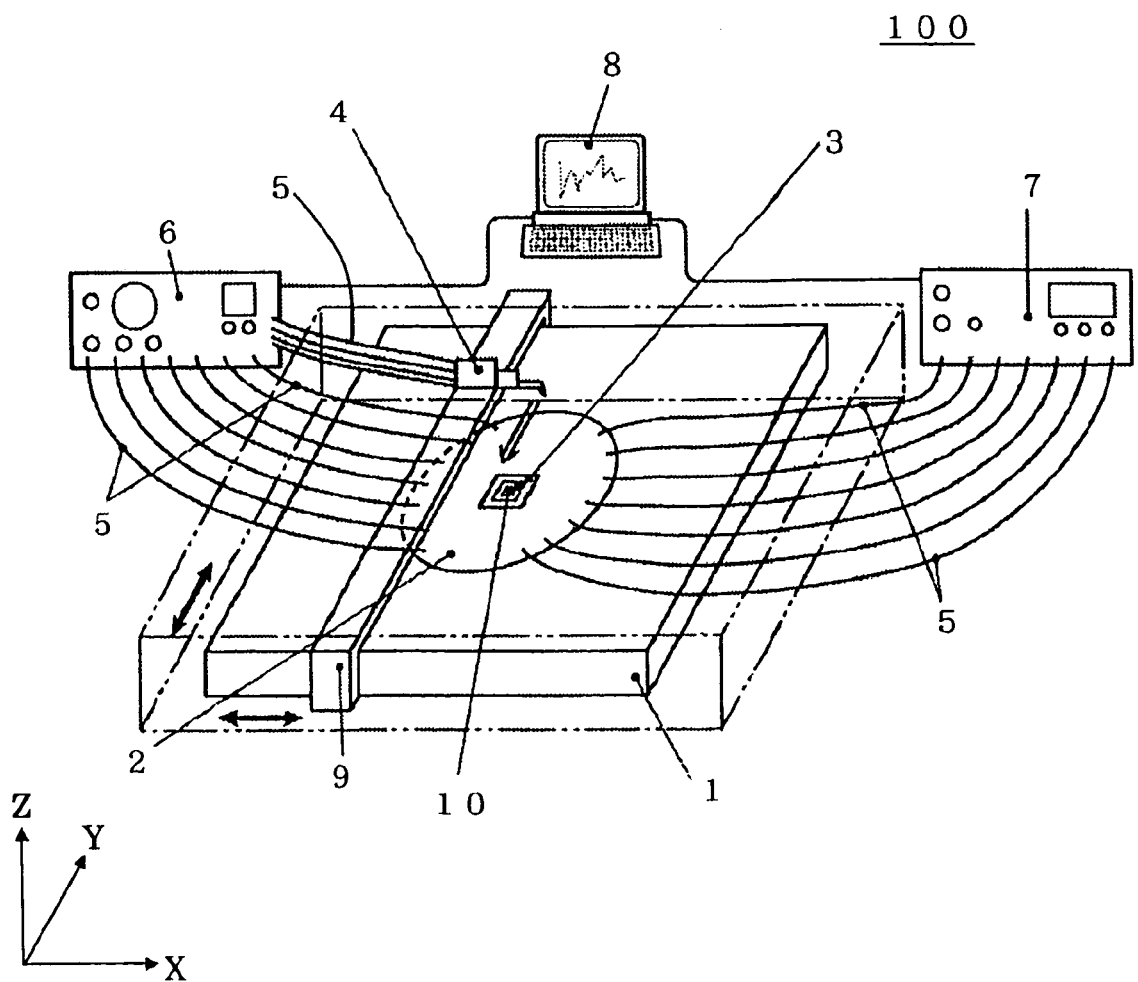
FIG. 1 is a perspective view showing the entire structure of the system in-package test inspection apparatus of the present invention.

Hereinafter, the preferred embodiments of the present invention will be described with reference to the accompanying drawings. FIG. 1 is a perspective view showing the entire structure of the system in-package test inspection apparatus (hereinafter referred to as SIP test inspection apparatus) of the present invention.

The SIP test inspection apparatus 100 shown in the same Figure has a high precision movable stage 1 which is movable at high precision in three directions, X, Y and Z-axes and a test card 2 is mounted on this high precision movable stage 1 as a printed wiring board capable of transmitting high velocity/high frequency signals. Further, a SIP socket 3 on which a system in-package (called SIP) of measuring object is mounted is loaded on the test card 2.

This SIP test inspection apparatus 100 includes an SIP evaluation signal generating device 6 (evaluation signal generating means) for generating an evaluation signal for inspection and a fine high frequency probe 4 (contact probe, hereinafter referred to as fine high frequency probe) for contacting the LSI chip on the SIP 10. The fine high frequency probe 4 is connected to a SIP evaluation signal generating device 6 through a coaxial cable 5.

Further, the SIP test inspection apparatus 100 comprises an SIP signal analyzer 7 (output signal detecting means) for detecting an outputted signal from the SIP 10 and a control computer 8 (analyzing means) for carrying out data analysis from a signal and the like detected from the SIP signal analyzer 7.

The test card 2 is connected to the SIP evaluation signal generating device 6 and the SIP signal analyzer 7 through other coaxial cable 5. Connection between the test card 2 and the SIP power supply (LSI chip driving means, not shown) is carried out thorough a power cable (not shown).

Figure 2:
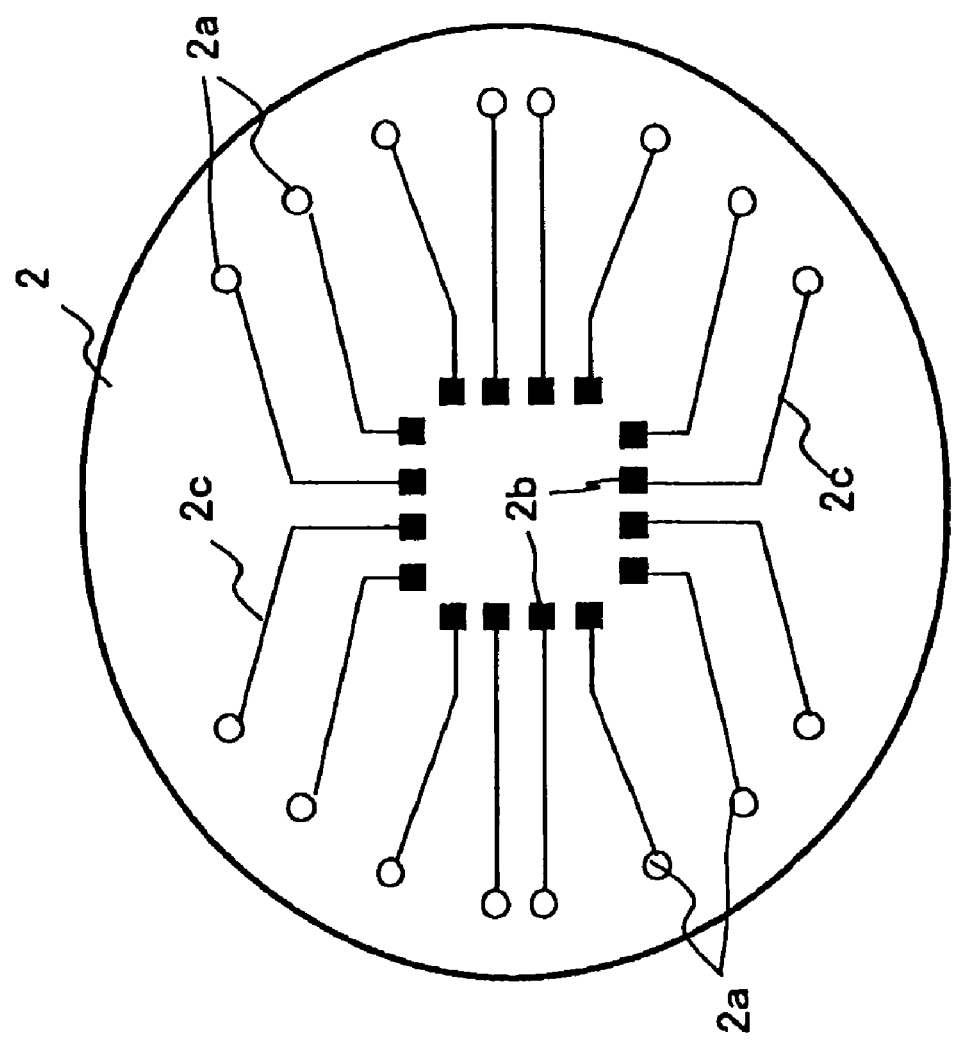
FIG. 2 is a plan view of a test card equipped on the system in-package test inspection apparatus shown in FIG. 1.

The test card 2 is a circular printed wiring board as shown in FIG. 2 and via holes 2a to be connected to the coaxial cable 5 are formed along the both sides of the substrate and electrode terminals 2b for the SIP socket 3 are provided in a square area substantially in the center of the substrate. Then, coaxial line paths 2c are disposed from each via hole 2a to the electrode terminal 2b.

If the test card 2 is formed of an ordinary FR-4 (flame resistant glass substance epoxy resin laminated board) printed circuit board, a signal supplied through that substrate is relatively slow, that is, 100 Mbps or less. Thus, this is limited to a low frequency area of 100 MHz or less. Therefore, the SIP test inspection apparatus of the present invention utilizes the test card 2 in which the coaxial line paths 2c are disposed in order to correspond to a high frequency signal. Consequently, high speed/high frequency signals in a high frequency area of 1 GHz or more can be handled at a high speed of 1 Gbps or more and further, influences of cross-talk between respective signal lines and external noise can be reduced.

The test card 2 which satisfies such a specification can be obtained by using the technology disclosed in, for example, the patent document applied by SHINWA Corp. Ltd.(Japanese Patent Application Laid-Open No. HEI10-65313, Japanese Patent Application Laid-Open No. 2003-349731).

The fine high frequency probe 4 is disposed on a probe supporting body 9 installed on the high precision movable stage and the front end (contact electrode) of the probe 4 can be adjusted in position at a high precision by a fine adjusting mechanism. Upon measurement, the fine high frequency probe 4 is fixed to the probe supporting body 9 in order to obtain a contact pressure by vacuum absorption or magnetic absorption and contacted to a LSI chip to be measured on the SIP 10. The front end of the fine high frequency probe 4 can be adjusted in position in terms of three directions, X, Y, Z and rotation direction by a vertical fine adjusting mechanism possessed by the stage 1.

Figure 3:
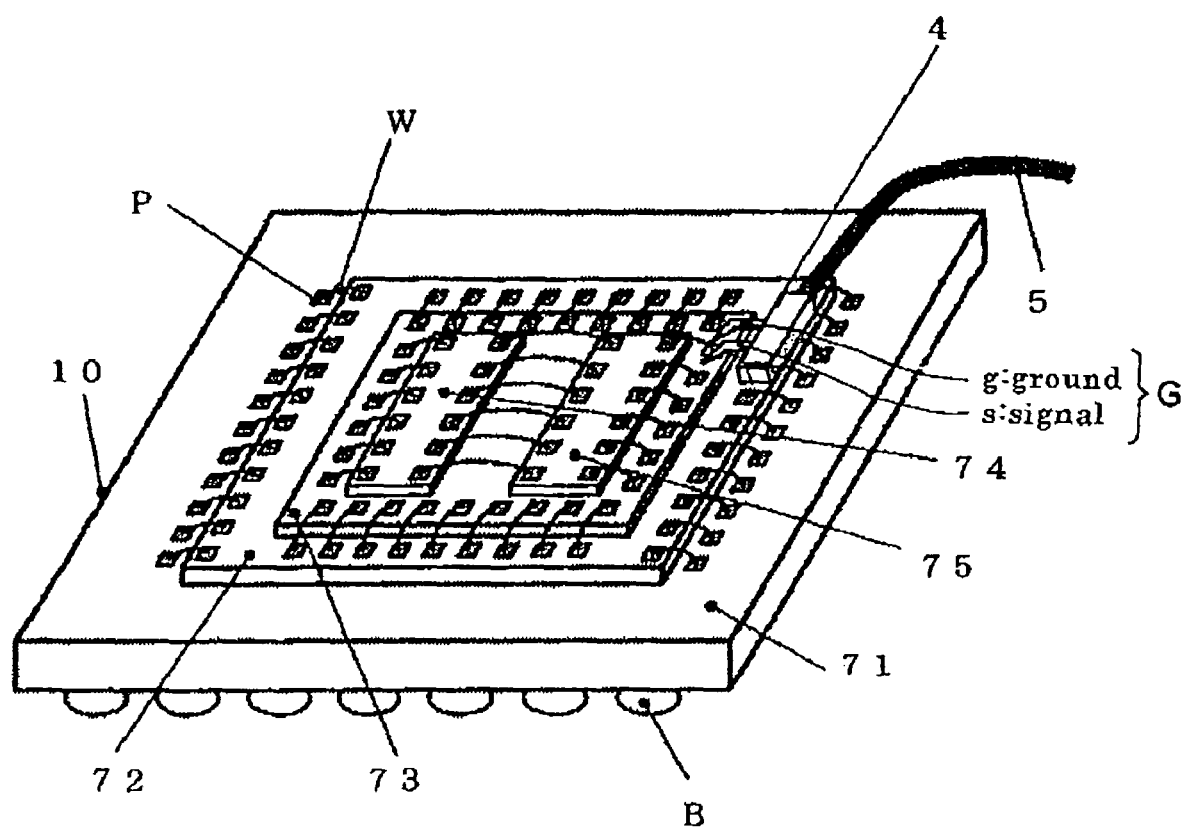
FIG. 3 is a diagram showing a state in which the LSI chip loaded on the system in-package is contacted by a fine high frequency probe provided on the system in-package test inspection apparatus of FIG. 1.

When as shown in FIG. 3, in the SIP 10, for example, LSI chips 71, 72, 73, 74, 75 are stacked on an LSI package 71 in which plural soldering balls B are formed as I/O terminals and the bonding pads P formed on the respective boards are connected with a bonding wire W, the front end G (ground, signal) of the fine high frequency probe 4 is contacted with a bonding pad P as shown in the same Figure.

Figure 4:
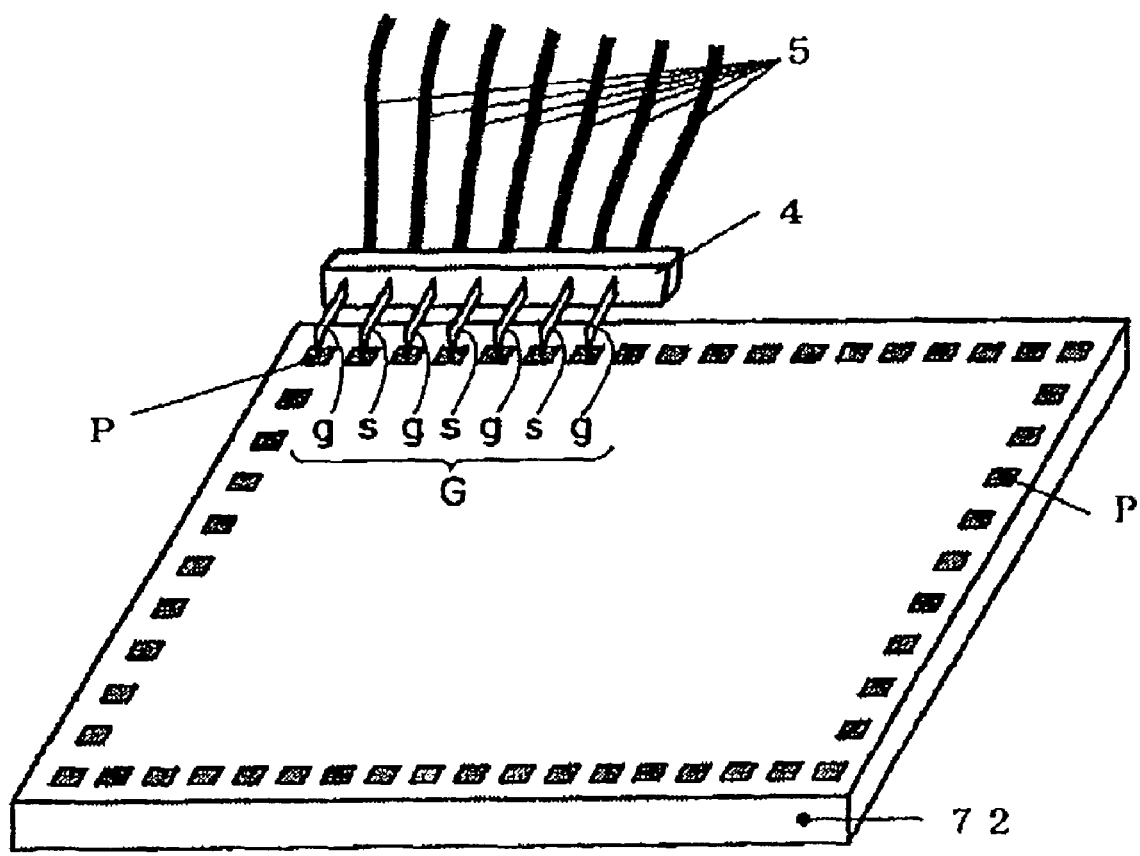
FIG. 4 is a diagram showing a state in which the LSI chip loaded on the system in-package is contacted by a fine high frequency probe provided on the system in-package test inspection apparatus of FIG. 1.

The fine high frequency probe 4 can correspond to multiple channels by disposing a multiplicity of the fine probe front ends G (ground, signal) in parallel to each other as shown in FIG. 4. In the meantime, FIG. 4 indicates that the multiple channel fine high frequency probe 4 is contacted with plural bonding pads P formed on the LSI chip 72.

In the fine high frequency probe 4 shown in FIGS. 3 and 4, an interval between a signal electrode and a ground electrode is of fine pitch from 20 micron to 100 micro in order to correspond to the pitch (about 20 micron to 150 micron) of the bonding pad electrode on an LSI chip to be measured.

The probe which satisfies this specification can be obtained by using the technology disclosed by the patent documents (Japanese Patent Application Laid-Open No. 2002-22769, Japanese Patent Application Laid-Open No. 2001-311744, Japanese Patent Application Laid-Open No. 2001-242193, Japanese Patent Application Laid-Open No. 2000-346872) applied by KIYOTA MANUFACTURING CO.

Subsequently, the procedure of a test inspection on the SIP using the SIP test inspection apparatus 100 will be described with reference to a flow diagram of FIG. 5.

Figure 5:
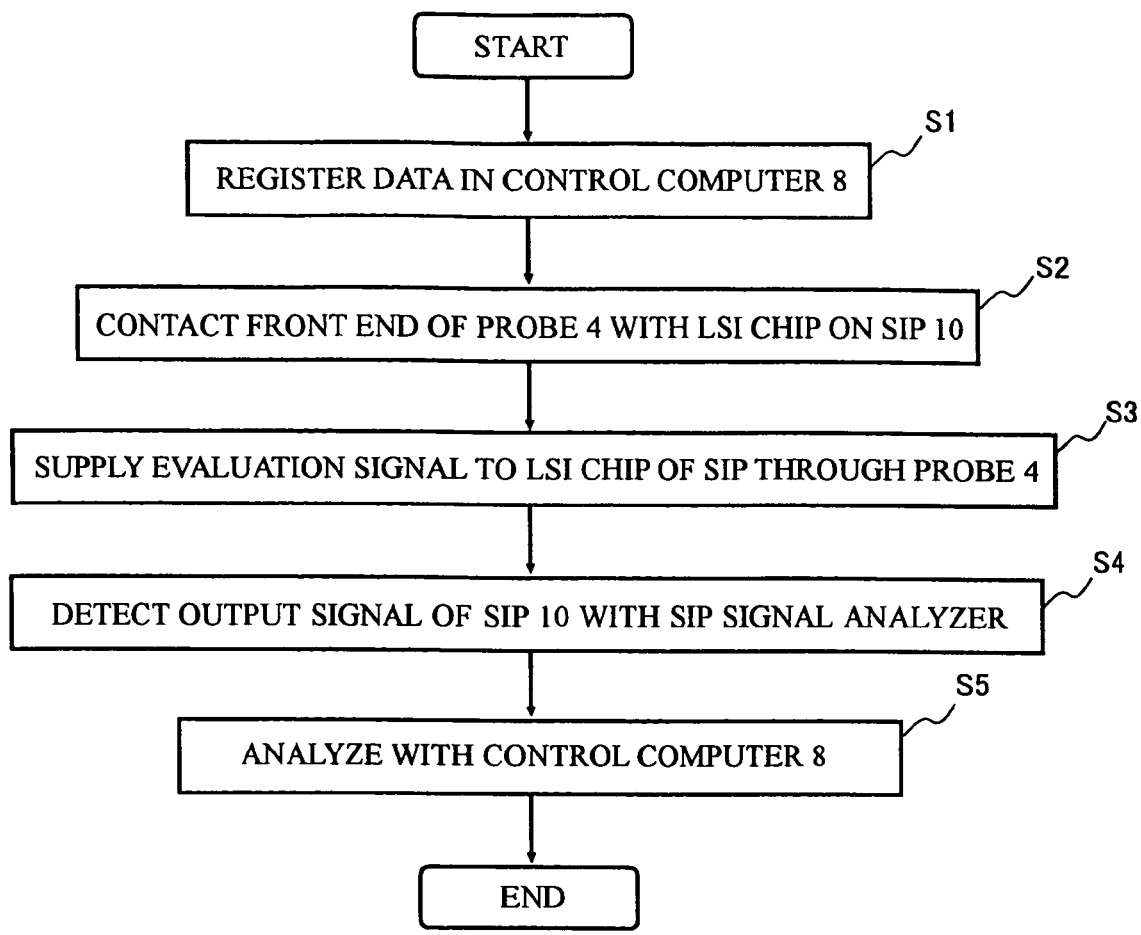
FIG. 5 is a flow diagram showing the procedure for carrying out the system in-package test inspection using the system in-package test inspection apparatus shown in FIG. 1.

First, SIP circuit data and inspection analysis data are registered on the SIP test inspection analysis program on the control computer 8 (step S1 of FIG. 5).

An SIP to be tested is inserted into the SIP socket 3 and the front end of the fine high frequency probe 4 is contacted with one of the LSI chips stacked in multiple layers on the SIP 10 (step S2 of FIG. 5).

Next, power supply and evaluation signal are supplied to the LSI chip on the SIP 10 from the SIP power supply and the SIP evaluation signal generating device 6 through the test card 2 and the fine high frequency probe 4 (step S3 of FIG. 5).

Next, a signal outputted from the SIP 10 through the test card 2 is detected by the SIP signal analyzer 7 (step S4 of FIG. 5).

Then, in the control computer 8, a signal detected in step S4 is analyzed by comparing with the inspection analysis data (step S5 of FIG. 5).

As described above, according to an embodiment of the present invention, high speed/high frequency test inspection can be carried out at a high precision by using a fine high frequency probe capable of contacting a signal line between the LSI chips stacked in multiple layers on the SIP accurately and further, a test card capable of handling high speed/high frequency signals. That is, an inspection signal can be inputted to the LSI chip not through a wiring formed within the LSI package and an influence of inductance within the LSI package can be reduced so that the high frequency signal can be transmitted excellently.

Therefore, on an SIP manufacturing site, implementation of acceptable product inspection and securing of reliability can be achieved. Further, the present invention can be applied to an error inspection to the SIP in new circuit design effectively.

Figure 6:
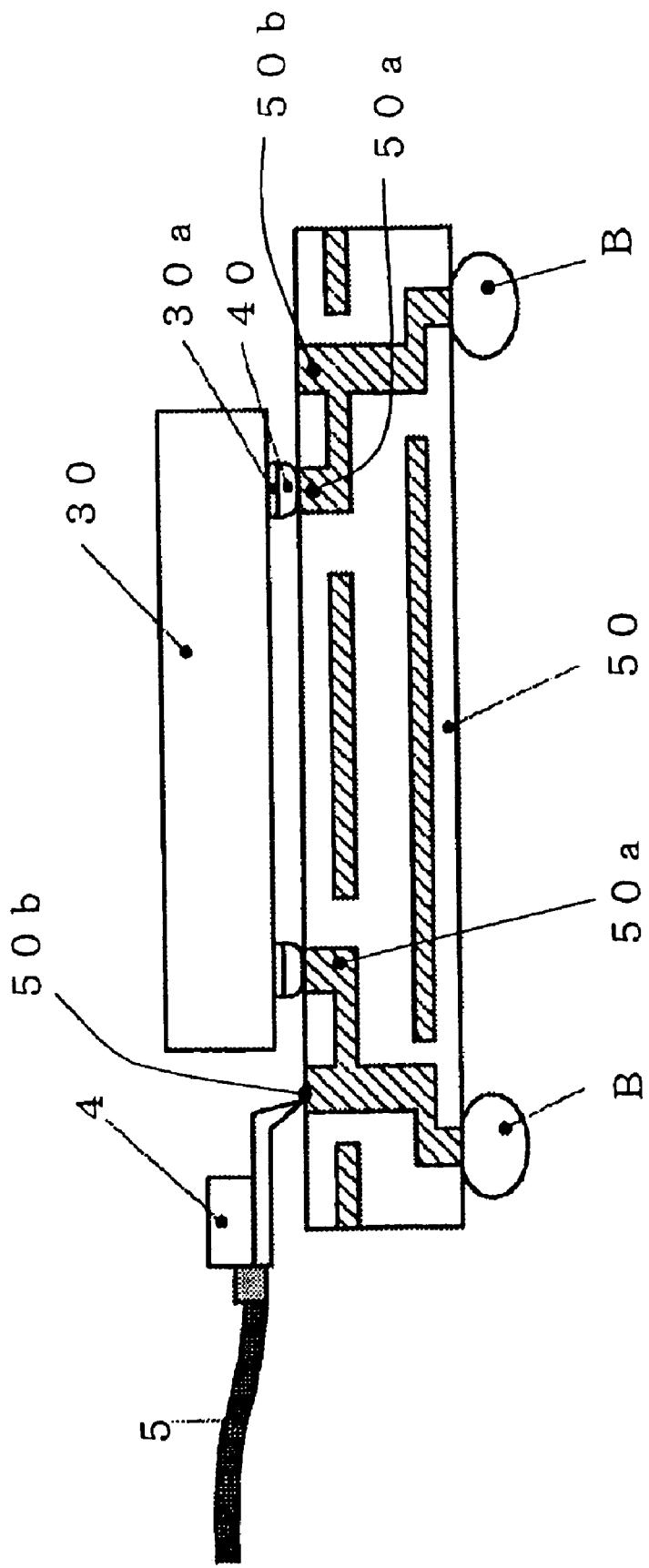
FIG. 6 is a diagram showing a state in which when an LSI chip and an LSI package are flip-chip connected, the LSI chip is contacted by the fine high frequency probe equipped on the system in-package test inspection apparatus of FIG. 1.
Figure 8:
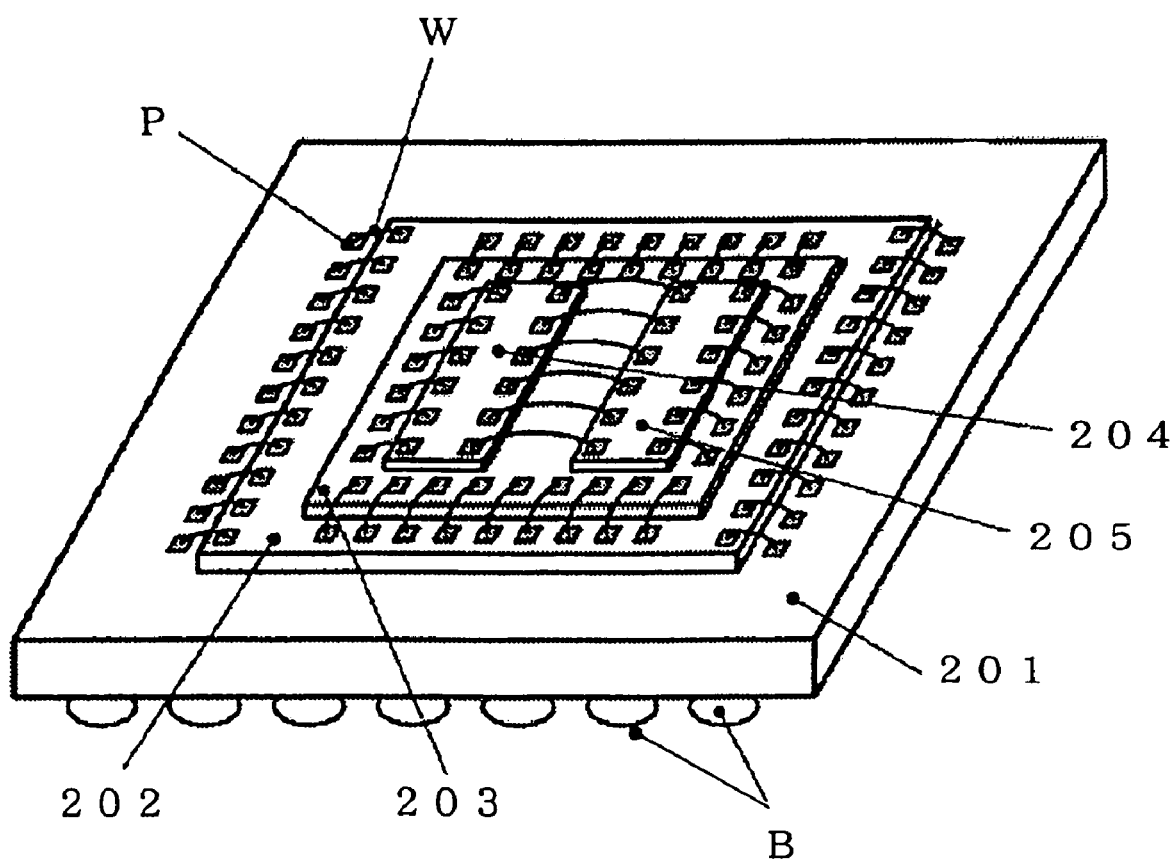
FIG. 8 is a diagram showing an example of the chip stack type system in-package.

Although in the above-described embodiment, a case where the LSI package and the LSI chip are connected through the wire bonding, as shown in FIG. 6, a pad 30a formed on the rear face of the LSI chip 30 and a pad 50a formed on the LSI package 50 are flip-chip connected through a bump 40 and if the connection portion is not exposed, an LSI package 50 having the structure shown in the same Figure is adopted.

That is, such a package structure in which a fine measuring pad 50b is exposed in a surrounding area of the LSI chip 30 on the halfway from the pad 50a on the LSI package 50 to the soldering ball 51 located below is desirable. Consequently, the fine high frequency probe 4 can be contacted with the measuring pad 50b, so that a signal can be inputted from a position near the pad 30a of the LSI chip 30. Therefore, the inspection signal can be inputted to the LSI chip 30 not through any wiring formed within the LSI package 50 thereby reducing influences of inductance within the LSI package 30 largely so as to transmit a high frequency signal excellently (for example, maximum frequency: 40 GHz, maximum transmission velocity: 10 Gbps).

What is claimed is:

1. A system in-package test inspection apparatus for measuring and evaluating the high-speed/high frequency characteristic of a system in-package through an electrode pad in which I/O terminals are formed on one side of an LSI package containing metallic wiring internally and plural LSI chips are stacked in multiple layers on the other face while electric connection between the LSI chip and the LSI package and the electric connection between the LSI chips are implemented, the system in-package test inspection apparatus comprising: a movable stage which is movable in three directions, X, Y and Z-axes; a printed wiring board to which the I/O terminals of the system in-package are connected comprising means for enabling transmission of high speed and high frequency signals by forming a signal transmission wire having a coaxial line structure that a signal line is surrounded by insulating layer with its outside covered with sealing electrode, the printed wiring board being mounted on the movable stage; a contact probe having a contact electrode which has a signal electrode and a ground electrode with a distance between the signal electrode and the ground electrode from 20 µm to 100 µm and comprising means for transmitting a high frequency signal, the contact probe being disposed on a probe supporting body installed on the movable stage; evaluation signal generating means for supplying a high frequency evaluation signal to the contact probe; output signal detecting means for detecting an output signal of the system in-package through the printed wiring board; analyzing means for analyzing a signal detected by the output signal detecting means; wherein said movable stage for connecting the contact electrode of the contact probe with said electrode pad formed on one of the plural LSI chips stacked in multiple layers adjusts the contact electrode in position in terms of three directions, X, Y, Z and rotation direction, wherein the evaluation signal of the evaluation signal generating means is not inputted to the LSI chip through metallic wiring within the LSI package.

2. The system in-package test inspection apparatus according to claim 1, wherein the contact probe has plural contact electrodes for transmitting independent signals and the plural contact electrodes are provided at an equal interval and in parallel to each other.

3. The system in-package test inspection apparatus according to claim 1, wherein the contact probe has plural contact electrodes for transmitting independent signals and the plural contact electrodes are provided at an equal interval and in parallel to each other.

4. The system in-package test inspection apparatus according to claim 1, wherein said printed wiring board is circular; via holes, connected to the coaxial line structure, are formed along the peripheral sides of the printed wiring board and electrode terminals for connection to the system in package are provided substantially in the center of the printed wiring board.

5. A system in-package test inspection method for measuring and evaluating the high-speed/high frequency characteristic of a system in-package by using the system in-package test inspection apparatus as in any one of claims 1, 2 and 3, the system in-package test inspection method comprising steps of: connecting the I/O terminals of the system in-package to a printed wiring board capable of transmitting a high speed/high frequency signal; making the contact electrode of a contact probe for transmitting the high frequency signal into a contact with said electrode pad formed on one of the plural LSI chips stacked in multiple layers so as to input a high frequency evaluation signal into the LSI chip through the electrode pad; inspecting the output signal of the system in-package through the printed wiring board; and analyzing the output signal.

* * * * *